US008077533B2

(12) United States Patent
Hunter et al.

(10) Patent No.: US 8,077,533 B2
(45) Date of Patent: Dec. 13, 2011

(54) MEMORY AND METHOD FOR SENSING DATA IN A MEMORY USING COMPLEMENTARY SENSING SCHEME

(75) Inventors: Bradford L. Hunter, Austin, TX (US); Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1336 days.

(21) Appl. No.: 11/337,783

(22) Filed: Jan. 23, 2006

(65) Prior Publication Data

US 2007/0171747 A1 Jul. 26, 2007

(51) Int. Cl.
| G11C 7/12 | (2006.01) |
| G11C 7/06 | (2006.01) |
| G11C 7/08 | (2006.01) |
| G11C 7/22 | (2006.01) |

(52) U.S. Cl. ........ 365/203; 365/204; 365/205; 365/207; 365/194; 365/233.1; 365/190

(58) Field of Classification Search ............. 365/230.03, 365/225.7, 189.07, 185.21, 233, 185.13, 365/185.11, 207, 205, 204, 203, 194, 190, 365/233.1

See application file for complete search history.

(56) References Cited

U.S. PATENT DOCUMENTS

| 4,150,441 A * | 4/1979 | Ando ............................. 365/190 |
| 4,964,083 A | 10/1990 | Nogle et al. |
| 5,986,914 A | 11/1999 | McClure |
| 6,021,062 A | 2/2000 | Matsuki |
| 6,111,796 A | 8/2000 | Chang et al. |
| 6,137,746 A | 10/2000 | Kengeri et al. |
| 6,198,682 B1 | 3/2001 | Proebsting |
| 6,249,471 B1 | 6/2001 | Roy |
| 6,292,402 B1 | 9/2001 | Hanson et al. |
| 6,614,696 B2 | 9/2003 | Kanno et al. |
| 7,136,312 B2 * | 11/2006 | Fujimoto et al. ............... 365/191 |
| 7,158,432 B1 * | 1/2007 | Hunter et al. ................. 365/207 |
| 2004/0100844 A1 | 5/2004 | Alvandpour et al. |
| 2004/0130926 A1 | 7/2004 | Nakase |
| 2004/0218457 A1 | 11/2004 | Terzioglu et al. |

FOREIGN PATENT DOCUMENTS

| EP | 0 684 707 A1 | 11/1995 |
| WO | WO 00/41199 A1 | 7/2000 |

* cited by examiner

Primary Examiner — J. H. Hur

(57) ABSTRACT

In a memory (100), a local data line pair (116, 118) is precharged to a first logic state and a global data line pair (101, 104) is precharged to a second logic state. A selected memory cell is coupled to the local data line pair (116, 118) to develop a differential local data line voltage. The differential local data line voltage is subsequently amplified to form an amplified differential local data line voltage. A selected one of the global data line pair (101, 104) is driven to the first logic state in response to the amplified differential local data line voltage to form a differential global data line voltage.

20 Claims, 3 Drawing Sheets

MEMORY AND METHOD FOR SENSING DATA IN A MEMORY USING COMPLEMENTARY SENSING SCHEME

CROSS REFERENCE TO RELATED, COPENDING APPLICATION

Related subject matter is found in our copending patent application Ser. No. 11/218,135, filed Sep. 1, 2005, entitled "MEMORY WITH ROBUST DATA SENSING AND METHOD FOR SENSING DATA" and assigned to the assignee hereof.

FIELD OF THE DISCLOSURE

The invention relates generally to memories, and more particularly to sense amplifiers for memories.

BACKGROUND

Integrated circuit memories are organized into one or more arrays each including a matrix of rows and columns, with a memory cell located at each intersection of a row and a column. When accessed during a read cycle, the memory decodes an address to enable one row line. The memory cells on the enabled row line provide their contents onto bit lines, or more commonly, onto differential bit line pairs. Column decoding is used to select a subset of the bit line pairs to connect to one or more differential data line pairs. A sense amplifier connected to each data line pair detects a logic state of the differential signal and amplifies it. The amplified signal may then be provided to an output terminal of the memory, or further decoding may take place.

The speed at which the decoding takes place together with the sense time determines the overall speed of the memory. To help improve the speed of the memory, the sense time may be reduced.

However larger density memories typically employ a sense hierarchy including not only bit lines, but also local data lines and global data lines. In these memories separate sense amplifiers are placed on the local data lines and the global data lines and are enabled in succession to prevent the sense amplifier from consuming excessive power or driving to opposite logic states before recovering. Thus the sequential nature of the local data line sensing and the global data line sensing has limited the ability to decrease access time. Moreover the timing is difficult to achieve since memory designers must design for worst-case conditions.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items.

DETAILED DESCRIPTION

Figure 1:
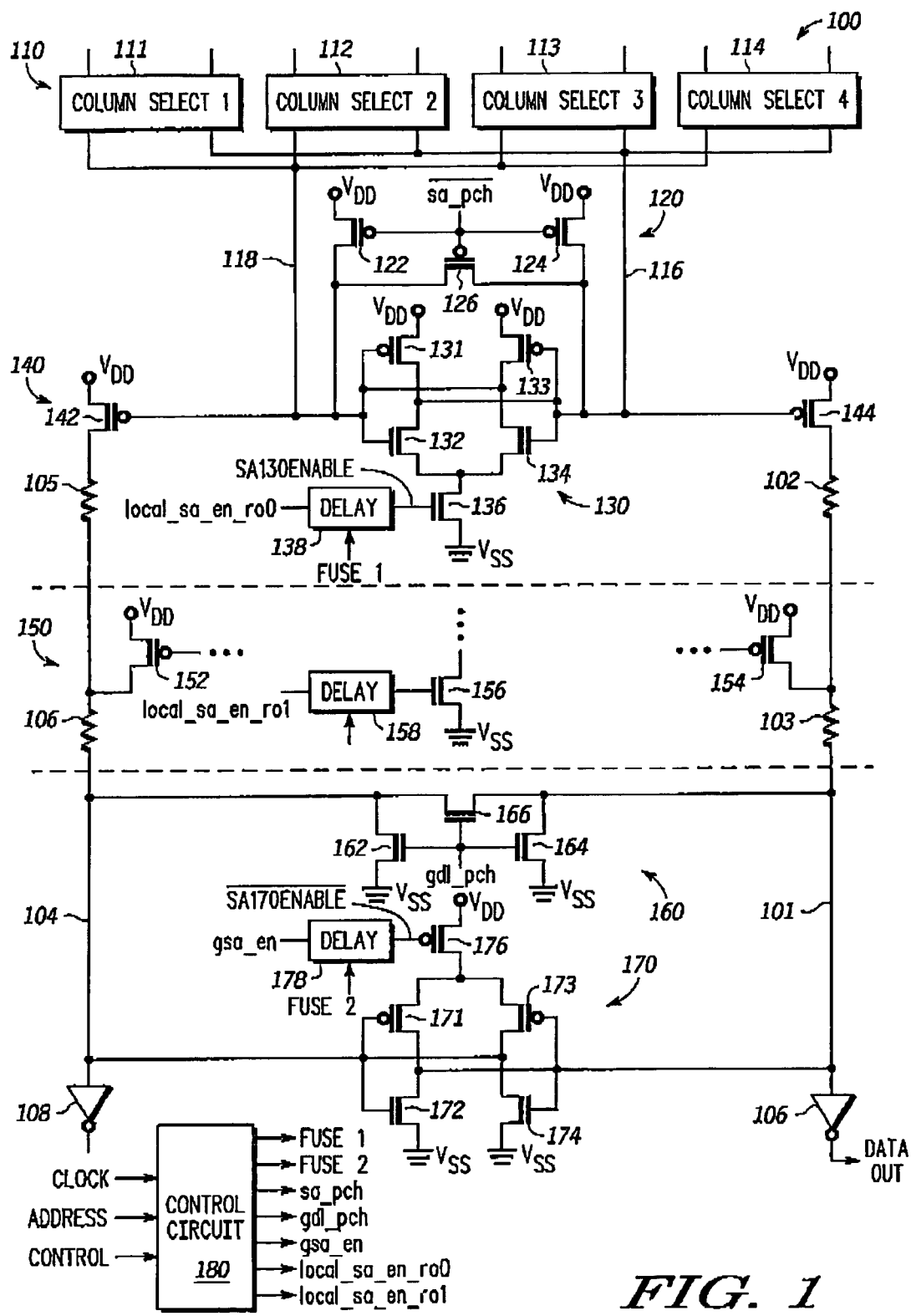
FIG. 1 illustrates in partial block diagram, partial logic diagram, and partial schematic form a memory according to the present invention.

In one form a method is disclosed for sensing data in a memory. A local data line pair is precharged to a first logic state and a global data line pair is precharged to a second logic state. A selected memory cell is coupled to the local data line pair to develop a differential local data line voltage. The differential local data line voltage is subsequently amplified to form an amplified differential local data line voltage. A selected one of the global data line pair is driven to the first logic state in response to the amplified differential local data line voltage to form a differential global data line voltage.

According to one aspect of this method the differential global data line voltage is subsequently amplified to form an amplified differential global data line voltage. In this case a data output signal may be outputted in response to the amplified differential global data line voltage. The data output signal may further be outputted in response to a voltage on a predetermined global data line of the global data line pair. In another case the differential global data line voltage may be subsequently amplified while the differential local data line voltage continues to be amplified, and the global data line voltage may continue to be amplified while the differential local data line voltage ceases to be amplified. In yet another case a global sense amplifier may be subsequently activated after a programmable delay determined in response to a state of at least one fuse.

According to another aspect of this method the local data line pair is precharged to a logic high state and the global data line pair is precharged to a logic low state.

According to yet another aspect of this method the differential local data line voltage is subsequently amplified by subsequently activating a local sense amplifier after a first programmable delay determined in response to a state of at least one fuse. In this case a global sense amplifier may be subsequently activated after a second programmable delay determined in response to a state of at least one other fuse.

According to still another aspect of this method, a selected local sense amplifier of a plurality of local sense amplifiers may be subsequently activated.

In another form, a method is disclosed for accessing data in a memory. A local data line pair is precharged to a first logic state. During a first time period, a memory cell is coupled to the local data line pair, and a global data line pair is precharged to a second logic state. During a subsequent second time period, a difference in voltage between first and second local data lines of the local data line pair is amplified, a selected global data line of the global data line pair is driven to the first logic state in response to a sensed voltage on the local data line pair, and a difference in voltage between first and second global data lines of the global data line pair is amplified. During a subsequent third time period, the difference in voltage between the first and second global data lines of the global data line pair is latched, and the local data line pair is precharged to the first logic state in preparation for a subsequent access.

According to one aspect of this method, the difference in voltage between the first and second global data lines of the global data line pair starts to be amplified a first programmable delay time after starting to amplify the difference in voltage between the first and second local data lines of the local data line pair.

According to another aspect of this method, the difference in voltage between the first and second global data lines of the global data line pair is latched by keeping a global sense amplifier active, thereby holding the difference in voltage between the first and second global data lines of the global data line pair.

According to still another aspect of this method, the memory cell is coupled to the local data line pair by coupling a bit line pair to which the memory cell is coupled to the local data line pair.

In yet another form, a memory includes a local data line pair, a local data line precharge circuit, a local sense amplifier, a global data line pair, a global data line precharge circuit, a driver circuit, a global sense amplifier, and a precharge circuit. The local data line precharge circuit is coupled to the local data line pair and to a first voltage representative of a first logic state. The local sense amplifier is coupled to the local data line pair and is active in response to a first control signal. The global data line precharge circuit is coupled to the global data line pair and to a second voltage representative of a second logic state. The driver circuit has inputs coupled to the local data line pair and to the first voltage, and outputs coupled to the global data line pair. The global sense amplifier is coupled to the global data lines and is active in response to a second control signal. The control circuit is responsive to a read cycle to activate the first control signal while the second control signal is inactive, to activate the second control while the first control signal remains active, and to deactivate the first control signal while the second control signal remains active.

According to one aspect of this memory, the local data line precharge circuit further has a control input for receiving a third control signal, and the control circuit activates the third control signal substantially while the first control signal is inactive.

According to another aspect of this memory, the local data line precharge circuit further includes first, second, and third transistors. The first transistor has a first current electrode for receiving the first voltage, a control electrode for receiving the third control signal, and a second current electrode coupled to a first local data line of the local data line pair. The second transistor has a first current electrode for receiving the first voltage, a control electrode for receiving the third control signal, and a second current electrode coupled to a second local data line of the local data line pair. The third transistor has a first current electrode coupled to the first local data line of the local data line pair, a control electrode for receiving the third control signal, and a second current electrode coupled to the second local data line of the local data line pair.

According to yet another aspect of this memory, the global data line precharge circuit further has a control input for receiving a fourth control signal, and the control circuit activates the fourth control signal substantially while the second control signal is inactive. In this case, the global data line precharge circuit may include fourth, fifth, and sixth transistors. The fourth transistor has a first current electrode coupled to a first global data line of the global data line pair, a control electrode for receiving the fourth control signal, and a second current electrode for receiving the second voltage. The fifth transistor has a first current electrode coupled to a second global data line of the global data line pair, a control electrode for receiving the fourth control signal, and a second current electrode for receiving the second voltage. The sixth transistor has a first current electrode coupled to the first global data line of the global data line pair, a control electrode for receiving the fourth control signal, and a second current electrode coupled to the second global data line of the global data line pair.

According to still another aspect of this memory, the local sense amplifier includes a programmable delay element having a first input for receiving the first control signal, and a second input for receiving a first fuse signal, and the global sense amplifier includes a second programmable delay element having a first input for receiving the second control signal, and a second input for receiving a second fuse signal.

As used in this Detailed Description and the accompanying claims, unless otherwise expressly defined herein, a word or phrase having a particular meaning to those of ordinary skill in the art shall be given this meaning and such meaning may later be established with reference to a publicly available technical dictionary or textbook. In the absence of such an express definition or particular technical meaning, a word or phrase shall have the meaning or meanings set forth in an accepted American English language dictionary. When words or phrases listed in such a dictionary have multiple definitions, the inventors intend the words or phrases to cover all the definitions that are not inconsistent with at least one embodiment in the Detailed Description and original claims.

Turning now to the drawings, FIG. 1 illustrates in partial block diagram, partial logic diagram, and partial schematic form a memory 100 according to the present invention. Memory 100 includes generally a global data line pair formed by global data lines 101 and 104, a column select portion 110, a local data line sense precharge circuit 120, a local data line sense amplifier 130, a driver portion 140, a second block portion 150, a global data line precharge circuit 160, a global data line sense amplifier 170, and a control circuit 180.

Global data line 101 has a parasitic resistance distributed along its length, illustrated in FIG. 1 as resistances 102 and 103 in series from top to bottom. Likewise global data line 104 has a parasitic resistance distributed along its length illustrated in FIG. 1 as resistances 105 and 106 in series from top to bottom. A first inverter 106 has an input terminal connected to the bottom of global data line 101, and an output terminal for providing an output signal labeled "DATA OUT". A second inverter 108 has an input terminal connected to global data line 104, and an output terminal.

Column select portion 110 includes column select blocks 111-114 labeled "COLUMN SELECT 1", "COLUMN SELECT 2", "COLUMN SELECT 3" and "COLUMN SELECT 4", respectively, and a local data line pair formed by local data lines 116 and 118. Each column select block selectively connects a differential bit line pair to local data lines 116 and 118 in response to decoded column address signals. Column decoding and selection are well known and will not be described further.

Local data line precharge block 120 includes P-channel MOS transistors 122, 124, and 126. Transistor 122 has a source connected to a power supply voltage terminal labeled "$V_{DD}$", a gate for receiving a control signal labeled "$\overline{sa\_pch}$", and a drain connected to local data line 118. $V_{DD}$ is a more positive power supply voltage terminal that in one embodiment has a voltage of 1.08 volts, but which may vary in other embodiments. Transistor 124 has a source connected to $V_{DD}$, a gate for receiving signal $\overline{sa\_pch}$, and a drain connected to local data line 116. Transistor 126 has a first source/drain terminal connected to local data line 118, a gate for receiving signal $\overline{sa\_pch}$, and a drain connected to local data line 116.

Local data line sense amplifier 130 includes a P-channel MOS transistor 131, an N-channel MOS transistor 132, a P-channel MOS transistor 133, an N-channel MOS transistor 134, an N-channel transistor 136, and a delay block 138. Transistor 131 has a source connected to $V_{DD}$, a gate connected to local data line 118, and a drain connected to local data line 116. Transistor 132 has a drain connected to the drain of transistor 131, a gate connected to local data line 118, and a source. Transistor 133 has a source connected to $V_{DD}$, a gate connected to local data line 116, and a drain connected to local data line 118. Transistor 134 has a drain connected to the drain of transistor 133, a gate connected to local data line 116, and a source. Transistor 136 has a drain connected to the sources of transistors 132 and 134, a gate for receiving a signal labeled "SA130ENABLE", and a source connected to a power supply voltage terminal labeled "$V_{SS}$". $V_{SS}$ is a more negative or ground power supply voltage terminal that has a nominal voltage of 0.0 volts. Delay element 128 has a signal input terminal for receiving a signal labeled "local_sa_en_ro0", a delay input terminal for receiving a signal labeled "FUSE 1", and an output terminal for providing signal SA130ENABLE.

Driver portion 140 includes P-channel MOS transistors 142 and 144. Transistor 142 has a source connected to $V_{DD}$, a gate connected to local data line 118, and a drain connected to global data line 104 above resistor 105. Transistor 144 has a source connected to $V_{DD}$, a gate connected to local data line 116, and a drain connected to global data line 101 above resistor 102.

Second block portion 150 includes P-channel MOS transistors 152 and 154, an N-channel MOS transistor 156, and a delay element 158. Transistor 152 has a source connected to $V_{DD}$, a gate connected to a first local data line in the memory block, and a drain connected to global data line 104 between resistors 105 and 106. Transistor 154 has a source connected to $V_{DD}$, a gate connected to a second local data line in the memory block, and a drain connected to global data line 101 between resistors 102 and 103. Transistor 156 has a drain, a gate, and a source connected to $V_{SS}$, and corresponds to transistor 136 in a similarly constructed sense amplifier in the memory block. Delay element 158 has a signal input terminal for receiving a signal labeled "local_sa_en_ro1", a delay input terminal, and an output terminal connected to the gate of transistor 156.

Global data line precharge circuit 160 includes N-channel MOS transistors 162, 164, and 166. Transistor 162 has a drain connected to global data line 104, a gate for receiving a control signal labeled "gdl_pch", and a source connected to $V_{SS}$. Transistor 164 has a drain connected to global data line 101, a gate for receiving signal gdl_pch, and a source connected to $V_{SS}$. Transistor 166 has a first source/drain terminal connected to global data line 104, a gate for receiving a signal gdl_pch, and a second source/drain terminal connected to global data line 101.

Global sense amplifier 170 includes a P-channel MOS transistor 171, an N-channel MOS transistor 172, a P-channel MOS transistor 173, an N-channel MOS transistor 174, a P-channel MOS transistor 176, and a delay element 178. Transistor 176 has a source connected to $V_{DD}$, a gate for receiving a signal labeled "$\overline{\text{SA170ENABLE}}$", and a drain. Transistor 171 has a source connected to the drain of transistor 176, a gate connected to global data line 104, and a drain connected to global data line 101. Transistor 172 has a drain connected to the drain of transistor 171, a gate connected to global data line 104, and a source connected to $V_{SS}$. Transistor 173 has a source connected to the drain of transistor 176, a gate connected to global data line 101, and a drain connected to global data line 104. Transistor 174 has a drain connected to the drain of transistor 173, a gate connected to global data line 101, and a source connected to $V_{SS}$. Delay element 178 has a signal input terminal for receiving a control signal labeled "gsa_en", a delay input terminal for receiving a signal labeled "FUSE 2", and an output terminal for providing signal $\overline{\text{SA170ENABLE}}$.

Control circuit 180 includes several input terminals that are shown as signal groups, including an input terminal for receiving a clock signal labeled "CLOCK", a set of address input terminals labeled "ADDRESS", and a set of control input terminals labeled "CONTROL". Control circuit 180 includes several output terminals for providing control signals. Pertinent control signal output terminals are shown in FIG. 1, including terminals for providing signals FUSE 1, FUSE 2, $\overline{\text{sa\_pch}}$, gdl_pch, gsa_en, local_se_en_ro0, and local_sa_en_ro1.

In general operation, memory 100 is a synchronous static random access memory (SRAM) that operates in response to the CLOCK signal. Memory 100 receives read and write cycles encoded on the CONTROL signal lines, and latches access addresses on the ADDRESS signal lines, all synchronously with the CLOCK signal. Note that in various embodiments memory 100 can also take the form of a synchronous dynamic random access memory (DRAM) or other type of memory and the sensing scheme disclosed herein is applicable to these various memory types.

During a read cycle control circuit 180 receives the CONTROL signals in a state to indicate a read command. It also receives a row address on the ADDRESS signal lines, activates a selected bank, and provides a latched row address to that bank for row decoding. The row decoder in the selected bank then activates a word line to activate all memory cells along the selected row. Each of these memory cells forms a differential voltage on a corresponding bit line pair. Note that in the case of an SRAM, memory cells are typically connected to both bit lines of a differential bit line pair, whereas in the case of a DRAM, memory cells are typically connected to one bit line of the differential bit line pair while the other bit line operates as a reference. Memory 100 also receives a column address on the ADDRESS signal lines. In the case of an SRAM, row and column addresses are typically received simultaneously whereas in the case of a DRAM, row and column addresses are typically received during successive cycles. In either case, a column decoder (not shown in FIG. 1) outputs a column select signal in response to a latched column address that causes one of column select circuits 111-114 to be activated and thereby connects a selected pair of bit lines to the local data line pair formed by local data lines 116 and 118.

Sensing during a read cycle takes place as follows. Local data line precharge circuit 120 precharges local data lines 116 and 118 to a logic high state, and they are in the logic high state at the beginning of the cycle. During a first time period, column selection causes a selected memory cell to be connected, through its corresponding bit lines and through an activated one of column select blocks 111-114, to local data lines 116 and 118. The differential voltage driven by the memory cell on the bit line pair will start to differentiate the local data lines. During this period of time, global data line precharge circuit 160 causes global data lines 101 and 104 to be precharged to a logic low state, which is opposite the logic state that local data lines 116 and 118 are precharged to.

During a second time period subsequent to the first time period, control circuit 180 disables global data line precharge circuit 160 and activates local sense amplifier 130 to amplify a difference in voltage between local data lines 116 and 118. When sense amplifier 130 has driven one of local data lines 116 and 118 to more than a threshold voltage below $V_{DD}$, the corresponding one of transistors 142 and 144 in driver portion 140 becomes conductive to drive the selected global data line to $V_{DD}$. The non-selected global data line remains precharged at $V_{SS}$. The parasitic resistance (illustrated by resistors 102 and 103 on global data line 101) and capacitance of the global data line determines the speed at which the conductive transistor raises the global data line voltage. After a certain amount of time, during which driver circuit 140 has driven one of the global data lines toward a logic high state and thereby developed a sufficient differential voltage between the global data lines, control circuit 180 activates global sense amplifier 170 to further amplify the differential voltage.

During a third time period subsequent to the second time period, control circuit 180 disables local sense amplifier 130, and enables local data line precharge circuit 120 in preparation for a subsequent access. The enabling of local data line precharge circuit 120 causes local data lines 116 and 118 to be driven to a logic high state, again disabling the selected transistor in driver circuit 140. However by this time global sense amplifier 170 has amplified the differential voltage between global data lines 101 and 104 sufficiently for global sense amplifier 170 to recognize the correct logic states. Control circuit 180 now keeps global sense amplifier 170 active to cause it to latch the differential voltage between the global data lines. Inverter 106 is used to output a single-ended DATA OUT signal in response to the voltage on global data line 101. Inverter 108 is present to equalize the loading between global data lines 101 and 104, but its output is not used.

By precharging the local data lines and global data lines to opposite logic states, and by appropriately overlapping the activation of the local and global sense amplifiers, memory 100 achieves extremely fast sensing time.

Memory 100 also has an important feature that helps it to maintain extremely fast sensing time even as manufacturing conditions vary. Control circuit 180 has associated with it fuses that are programmable during, for example, factory test to set the values of the FUSE 1 and FUSE 2 control signals. These multi-bit control signals set the activation timing of local sense amplifier 130 and global sense amplifier 170 through respective programmable delay elements 138 and 178. Thus, memory 100 provides the ability to programmably tune the timing to compensate memory 100 for manufacturing process variations. Since timing is important, the use of fuses to vary both the local sense amplifier and the global sense amplifier turn on time periods provides great flexibility. Note that FIG. 1 illustrates control circuit 180 generating the FUSE 1 and FUSE 2 control signals and thus actual fuse elements and any associated circuitry, such as buffers and decoders, are considered to be part of control circuit 180. In other embodiments the fuses and any associated circuitry such as buffers and decoders may be considered to be separate elements. Note also that as used herein, a "fuse" is intended to encompass a variety of circuit elements whose states can be selectively and permanently altered, including fuses that are normally closed but can be selectively opened, so-called "anti-fuses" that are normally open but can be selectively closed, one-time programmable non-volatile memory cells that can be selectively programmed, and the like.

Memory 100 can also grow in size by adding additional memory blocks along global data lines 101 and 104. Each additional memory block would be connected to global data lines 101 and 104 through transistors corresponding to transistors 142 and 144, and would have a local data line sense amplifier selected by a corresponding control signal.

Figure 2:
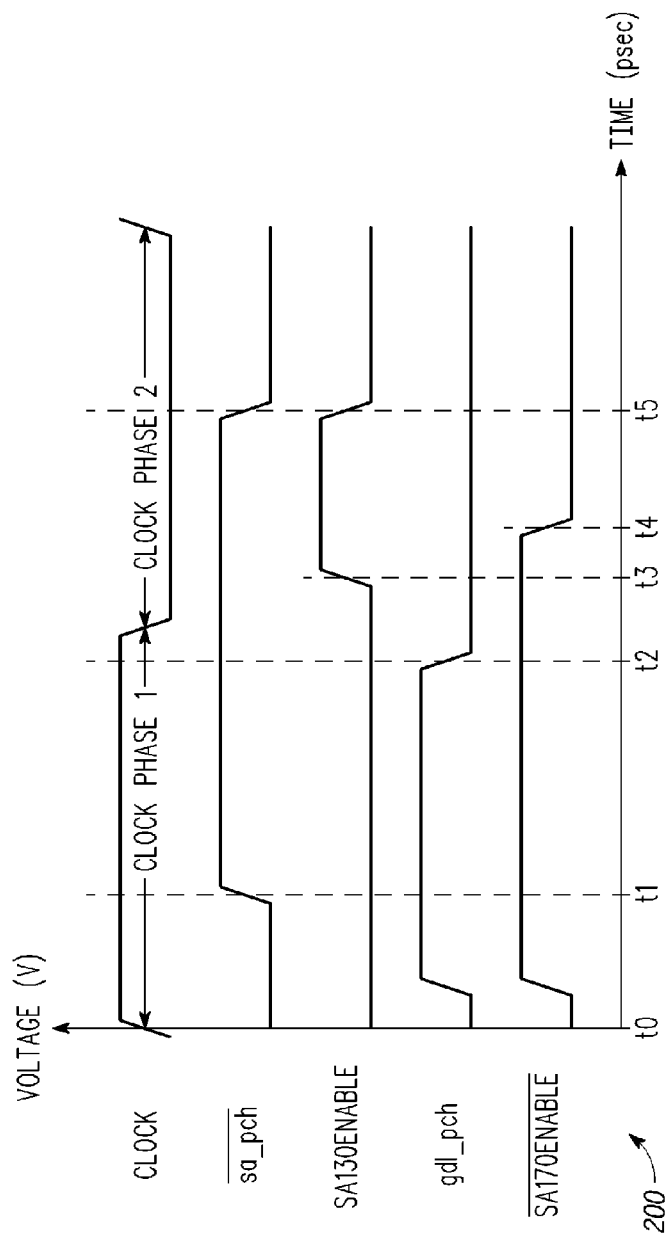
FIG. 2 illustrates a timing diagram useful in understanding the operation of the memory of FIG. 1.

FIG. 2 illustrates a timing diagram 200 useful in understanding the operation of memory 100 of FIG. 1. In timing diagram 200, the horizontal axis represents time in picoseconds (psec), whereas the vertical axis represents the voltage of various signals, including CLOCK, $\overline{\text{sa\_pch}}$, SA130ENABLE, gdl_pch, and $\overline{\text{SA170ENABLE}}$. The operation is shown in relation to two phases of the CLOCK signal labeled "CLOCK PHASE 1" during which the CLOCK signal is a logic high, and "CLOCK PHASE 2" during which the CLOCK signal is a logic low. FIG. 2 illustrates several time points of interest, labeled "t0", "t1", "t2", "t3", "t4", and "t5". Time t0 occurs at the beginning of CLOCK PHASE 1. Between t0 and t1, which corresponds to a data hold time for a previous access, $\overline{\text{sa\_pch}}$ is active at a logic low voltage to precharge local data lines 116 and 118 to a logic high voltage. gdl_pch becomes active at a logic high voltage to precharge the global data lines to a logic low voltage, and $\overline{\text{SA170ENABLE}}$ becomes inactive at a logic high voltage.

The first time period occurs between times t1 and t2. During this time period, $\overline{\text{sa\_pch}}$ becomes inactive to disable local data line precharge circuit 120. gdl_pch remains active at a logic high voltage, and $\overline{\text{SA170ENABLE}}$ goes inactive at a logic high voltage to disable global sense amplifier 170.

The second time period occurs between times t2 and t5. Time t2 coincides with the falling edge of the gdl_pch signal which in FIG. 2 occurs shortly before the start of CLOCK PHASE 2. During this time period, sa_pch remains inactive at a logic high voltage. A short time after t2, at time t3, SA130ENABLE becomes active at a logic high voltage to amplify the voltage developed between local data lines 116 and 118. Then subsequently during the second time period at time t4, $\overline{\text{SA170ENABLE}}$ becomes active to activate global sense amplifier 170. Control circuit 180 outputs the FUSE 1 and FUSE 2 signals to precisely control the timing of t3 and t4 to ensure that global sense amplifier 170 is activated after driver 140 has started to develop a logic high voltage on a global data line. During the remainder of the second time period, SA130ENABLE and $\overline{\text{SA170ENABLE}}$ are both active.

The third time period occurs between time t5 and time t1 of a subsequent read cycle (or a corresponding time point if the subsequent cycle is a write cycle). At time t5, SA130ENABLE becomes inactive at a logic low voltage to disable sense amplifier 130, while $\overline{\text{sa\_pch}}$ becomes active at a logic low voltage to enable local data line precharge circuit 120. Note that control circuit 180 keeps $\overline{\text{SA170ENABLE}}$ active at a logic low voltage. During this third time period, sense amplifier 170 acts as a latch to hold the differential voltage developed between global data lines 101 and 104 during the second time period.

Figure 3:
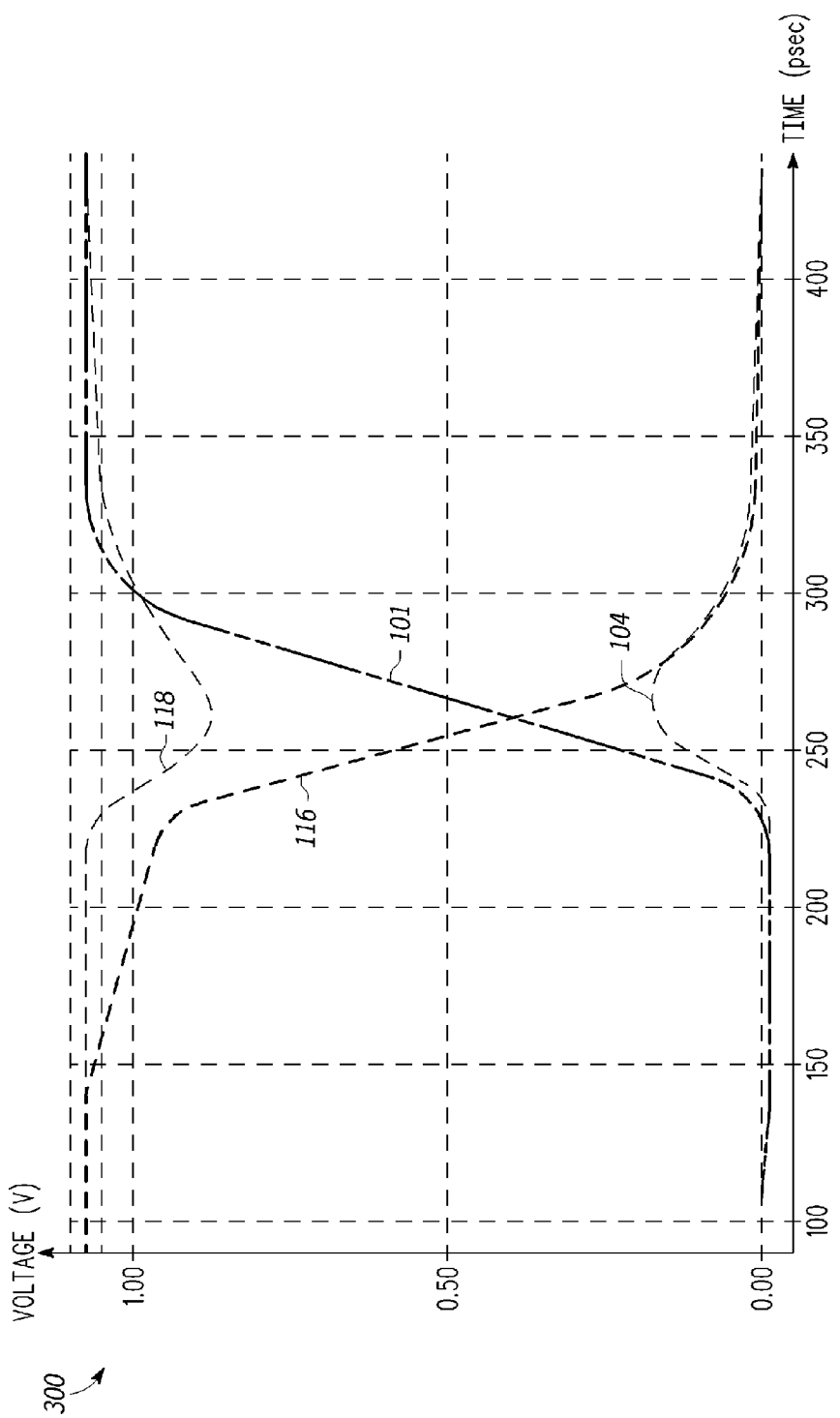
FIG. 3 illustrates another timing diagram useful in understanding the operation of the memory of FIG. 1.

FIG. 3 illustrates another timing diagram 300 useful in understanding the operation of memory 100 of FIG. 1. In timing diagram 100, the horizontal axis represents time in psec, whereas the vertical axis represents the voltage in volts (V) of local data lines 116 and 118 and global data lines 101 and 104. Note that the same reference numbers are used to indicate corresponding voltages. Local data lines 116 and 118 begin in the precharged state at a logic high voltage of about 1.08 volts. At about 140 psec, the selected memory cell that is connected to the local data lines through the column selection circuit starts to differentiate the voltage between the local data lines. In this example, the selected memory cell drives the bit line corresponding to local data line 116 toward a logic low level. By about 220 psec, the selected memory cell has created a differential voltage of about 0.1 volts between local data lines 116 and 118. At this time, control circuit 180 enables local sense amplifier 130, causing it to develop a larger differential voltage between the local data lines. Thus the slope of the voltage on local data line 116 increases after about 220 psec. Note that the voltage on local data line 118 initially falls through the operation of the inverter formed by transistors 133 and 134, but it starts to rise at about 250 psec when the voltage on local data line 116 falls below the inverter's switchpoint.

At about 235 psec, global data lines 101 and 104 begin to differentiate. Global data line 101 (corresponding to local data line 116) begins to rise in voltage. Global sense amplifier 170 also initially increases the voltage on global data line 104, but at a slower rate. Eventually the voltage on global data line 101 through the inverter formed by transistors 173 and 174 begins to switch to drive the voltage on global data line 104 back toward ground. By about 300 psec, the operation of global sense amplifier 170 has developed a differential voltage of almost 1.0 volt, which it continues to hold by operating as a latch.

Note that in the illustrated embodiment the local data lines were precharged to a logic high voltage while the global data lines were precharged to a logic low. In another embodiment, the local data lines could be precharged to a logic low while the global data lines are precharged to a logic high voltage. Also note that in the illustrated embodiment local data lines 116 and 118 were connected through column selection circuits to bit lines, and through driver circuit 140 to global data lines. In other embodiments, the local and global data lines could be in different positions in the sense hierarchy. For example in one alternate embodiment, an extra level of sensing could take place in which the illustrated local data lines are connected through another level of sensing (which may or may not include another level of decoding) to other local data lines that themselves are connected to bit lines. In this embodiment, complementary precharge, i.e. alternating precharge high and precharge low between data line segments, and overlapping of the sense amplifiers would be employed. Moreover the technique could be expanded to an arbitrary number of levels of the sense hierarchy.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for sensing data in a memory comprising:
   precharging a local data line pair to a first logic state and a global data line pair to a second logic state;
   coupling a selected memory cell to said local data line pair to develop a differential local data line voltage;
   subsequently amplifying said differential local data line voltage to form an amplified differential local data line voltage; and
   driving a selected one of said global data line pair to said first logic state in response to said amplified differential local data line voltage to form a differential global data line voltage.

2. The method of claim 1 further comprising:
   subsequently amplifying said differential global data line voltage to form an amplified differential global data line voltage.

3. The method of claim 2 further comprising:
   outputting a data output signal in response to said amplified differential global data line voltage.

4. The method of claim 2 wherein said subsequently amplifying said differential global data line voltage comprises:
   starting to amplify said differential global data line voltage after starting to amplify said differential local data line voltage.

5. The method of claim 2 wherein said subsequently amplifying said differential global data line voltage comprises:
   subsequently amplifying said differential global data line voltage while continuing to amplify said differential local data line voltage, and continuing to amplify said global data line voltage while ceasing to amplify said differential local data line voltage.

6. The method of claim 2 wherein said subsequently amplifying said differential global data line voltage further comprises:
   subsequently activating a global sense amplifier after a programmable delay determined in response to a state of at least one fuse.

7. The method of claim 1 wherein said precharging comprises:
   precharging said local data line pair to a logic high state and said global data line pair to a logic low state.

8. The method of claim 1 wherein said subsequently amplifying said differential local data line voltage comprises:
   subsequently activating a local sense amplifier after a first programmable delay determined in response to a state of at least one fuse.

9. The method of claim 8 further comprising:
   subsequently activating a global sense amplifier after a second programmable delay determined in response to a state of at least one other fuse.

10. The method of claim 1 wherein said subsequently amplifying said differential local data line voltage comprises:
    subsequently activating a selected local sense amplifier of a plurality of local sense amplifiers.

11. A method for accessing data in a memory comprising:
    precharging a local data line pair to a first logic state;
    during a first time period, coupling a memory cell to said local data line pair, and precharging a global data line pair to a second logic state;
    during a subsequent second time period, amplifying a difference in voltage between first and second local data lines of said local data line pair, driving a selected global data line of said global data line pair to said first logic state in response to a sensed voltage on said local data line pair, and amplifying a difference in voltage between first and second global data lines of said global data line pair; and
    during a subsequent third time period, latching said difference in voltage between said first and second global data lines of said global data line pair, and precharging said local data line pair to said first logic state in preparation for a subsequent access.

12. The method of claim 11, further comprising the step of:
    starting to amplify said difference in voltage between said first and second global data lines of said global data line pair a first programmable delay time after starting to amplify said difference in voltage between said first and second local data lines of said local data line pair.

13. The method of claim 11 wherein said latching comprises:
    keeping a global sense amplifier active, thereby holding said difference in voltage between said first and second global data lines of said global data line pair.

14. The method of claim 11 wherein coupling said memory cell to said local data line pair comprises:
    coupling a bit line pair to which said memory cell is coupled to said local data line pair.

15. A method for sensing data in a memory comprising:
    precharging a local data line pair to a first logic state;
    precharging a global data line pair to a second logic state;
    coupling a selected memory cell to said local data line pair to develop a differential voltage on said local data line pair;
    amplifying said differential voltage on said local data line pair;

driving a differential voltage on said global data line pair in response to said differential voltage on said local data line pair; and amplifying said differential voltage on said global data line pair while amplifying said differential voltage on said local data line pair.

16. The method of claim 15 wherein said amplifying said differential voltage on said global data line pair comprises:

beginning to amplify said differential voltage on said global data line pair after beginning to amplify said differential voltage on said local data line pair, and continuing to amplify said differential voltage on said global data line pair while ceasing to amplify said differential voltage on said local data line pair.

17. The method of claim 15 wherein said precharging said local data line pair to said first logic state comprises precharging said local data line pair to a logic high state, and said precharging said global data line pair to said second logic state comprises precharging said global data line pair to a logic low state.

18. The method of claim 15 wherein said amplifying said differential voltage on said local data line pair comprises:

activating a local sense amplifier after a first programmable delay determined in response to a state of at least one fuse.

19. The method of claim 18 wherein said activating said differential voltage on said global data line pair comprises:

activating a global sense amplifier after a second programmable delay determined in response to a state of at least one other fuse.

20. The method of claim 15 wherein said driving said differential voltage on said global data line pair comprises:

driving a selected one of said global data line pair to said first logic state in response to said differential voltage on said local data line pair to form said differential voltage on said global data line pair.

* * * * *